(12) United States Patent
Schmuckle

(10) Patent No.: US 9,345,155 B1
(45) Date of Patent: *May 17, 2016

(54) LANDSCAPE CONTROLLER HOUSING WITH PIVOTABLE LOCKING FACE PACK

(71) Applicant: Hunter Industries, Inc., San Marcos, CA (US)

(72) Inventor: Darrin I. Schmuckle, Vista, CA (US)

(73) Assignee: Hunter Industries, Inc., San Marcos, CA (US)

( * ) Notice: Subject to any disclaimer, the term of this patent is extended or adjusted under 35 U.S.C. 154(b) by 400 days.

This patent is subject to a terminal disclaimer.

(21) Appl. No.: 13/912,671

(22) Filed: Jun. 7, 2013

Related U.S. Application Data

(63) Continuation of application No. 13/098,319, filed on Apr. 29, 2011, now Pat. No. 8,498,099.

(51) Int. Cl.
| H05K 7/00 | (2006.01) |
| H05K 7/16 | (2006.01) |
| H05K 5/02 | (2006.01) |

(52) U.S. Cl.
CPC ............ H05K 5/0226 (2013.01); H05K 5/0247 (2013.01)

(58) Field of Classification Search
CPC .................................................. H05K 5/0017
USPC ................. 361/600, 610, 615, 627, 807, 809, 361/679.04, 679.06, 679.29, 679.27, 622, 361/679.01; 174/50, 520, 535, 542
See application file for complete search history.

(56) References Cited

U.S. PATENT DOCUMENTS

| 4,704,604 | A | * | 11/1987 | Fuhs ..................... G06F 3/0202 16/254 |
| 5,862,468 | A | | 1/1999 | Kim |
| 5,868,316 | A | | 2/1999 | Scott |
| 5,956,248 | A | * | 9/1999 | Williams ............... A01G 25/16 239/69 |
| 5,979,482 | A | | 11/1999 | Scott |
| 5,979,863 | A | | 11/1999 | Lousberg |
| 5,996,608 | A | | 12/1999 | Hunter et al. |
| 6,158,278 | A | | 12/2000 | Klinefelter |
| 6,164,645 | A | * | 12/2000 | Weiss ................... G07F 17/3213 273/138.2 |
| 6,443,783 | B1 | | 9/2002 | Beadle |
| 6,497,592 | B1 | | 12/2002 | Beadle |
| 6,570,109 | B2 | | 5/2003 | Klinefelter et al. |
| 6,682,161 | B2 | | 1/2004 | Yun |
| 6,721,630 | B1 | | 4/2004 | Woytowitz |
| 6,791,844 | B2 | | 9/2004 | Tobishima et al. |
| 6,842,667 | B2 | | 1/2005 | Beutler et al. |
| 6,977,351 | B1 | | 12/2005 | Woytowitz |

(Continued)

*Primary Examiner* — Dimary Lopez Cruz
(74) *Attorney, Agent, or Firm* — Knobbe, Martens, Olson & Bear, LLP

(57) ABSTRACT

A landscape controller housing can be used to enclose the electronic components of a landscape lighting system or an irrigation system includes a face pack that is pivotably and removably mounted in an outer housing. The face pack can be installed in the outer housing in a normal upright position in which a pair of pivot pins are each received in a corresponding bearing slot and a pair of locking pins are each received in a corresponding lock recess. The face pack can be swung through a predetermined angle to release the locking pins from the lock recesses to allow the face pack to be removed from the outer housing by sliding the pivot pins out of the bearing slots and removing the locking pins from the lock recesses. The face pack can be inserted into the outer housing into a substantially horizontal service position by sliding both the pivot pins and the locking pins into the bearing slots.

18 Claims, 21 Drawing Sheets

(56) References Cited

U.S. PATENT DOCUMENTS

| | | | |
|---|---|---|---|
| 7,069,115 B1 | 6/2006 | Woytowitz | |
| 7,225,058 B1 | 5/2007 | Porter | |
| 7,243,005 B1 | 7/2007 | Beutler et al. | |
| 7,257,465 B2 | 8/2007 | Perez et al. | |
| 7,267,613 B2 * | 9/2007 | Cole | G07F 17/3216 463/20 |
| 7,289,886 B1 | 10/2007 | Woytowitz | |
| 7,387,572 B2 * | 6/2008 | Hanchar | G07F 17/32 361/679.61 |
| D580,373 S | 11/2008 | Stange et al. | |
| 7,457,687 B1 | 11/2008 | Porter | |
| 7,503,346 B1 | 3/2009 | Clark | |
| 7,613,547 B1 | 11/2009 | Woytowitz | |
| D607,759 S | 1/2010 | Woytowitz et al. | |
| D607,847 S | 1/2010 | Elliott et al. | |
| 7,665,713 B1 | 2/2010 | Clark | |
| D612,813 S | 3/2010 | Paul | |
| D613,255 S | 4/2010 | Paul | |
| 7,762,627 B2 * | 7/2010 | Chang | B60R 11/0235 297/217.1 |
| 7,772,726 B1 | 8/2010 | Porter et al. | |
| 7,806,382 B1 | 10/2010 | Palumbo et al. | |
| 7,844,367 B2 | 11/2010 | Nickerson et al. | |
| 7,891,370 B1 | 2/2011 | Stange | |
| 7,899,581 B1 | 3/2011 | Woytowitz | |
| 7,916,455 B2 | 3/2011 | Yoshida et al. | |
| D638,914 S | 5/2011 | Schmuckle | |
| D643,093 S | 8/2011 | Schmuckle et al. | |
| D653,219 S | 1/2012 | Woytowitz et al. | |
| 8,271,144 B2 | 9/2012 | Kah, Jr. | |
| D668,231 S | 10/2012 | Paul et al. | |
| 8,297,314 B2 | 10/2012 | Clark et al. | |
| 8,371,325 B1 | 2/2013 | Grizzle | |
| 8,867,194 B2 | 10/2014 | Woytowitz et al. | |
| 2005/0055106 A1 | 3/2005 | Beutler et al. | |
| 2005/0231458 A1 | 10/2005 | Miki | |
| 2008/0058964 A1 | 3/2008 | Nickerson et al. | |
| 2010/0084985 A1 | 4/2010 | Woytowitz | |
| 2011/0297757 A1 | 12/2011 | Schmuckle | |
| 2012/0274219 A1 | 11/2012 | Woytowitz et al. | |

* cited by examiner

LANDSCAPE CONTROLLER HOUSING WITH PIVOTABLE LOCKING FACE PACK

CROSS-REFERENCE TO RELATED APPLICATIONS

Any and all priority claims identified in the Application Data Sheet, or any correction thereto, are hereby incorporated by reference under 37 CFR 1.57.

FIELD OF THE INVENTION

The present invention relates to housings for electrical equipment, and more particularly, to housings for electronic controllers used to power light fixtures of a landscape lighting system and/or valves of a landscape irrigation system.

BACKGROUND

Landscape light fixtures are often installed around residences, apartments and commercial buildings for aesthetic enhancement and for improved safety. Electronic controllers are used to power the light fixtures of a landscape lighting system. The typical electronic controller of a landscape lighting system includes a power supply which steps down the 110 volt household AC voltage to a safer 12 volts. It also usually includes a control panel with manual inputs for setting ON and OFF times for the light fixtures. Many areas of the United States have insufficient rainfall at times to maintain the health of lawns, shrubs and other landscape vegetation and therefore irrigation systems with solenoid actuated valves are frequently utilized. The typical electronic controller used in a residential or commercial irrigation system includes a power supply and control panel with manual inputs for selecting the desired cycles and run times for various irrigation zones. A processor selectively energizes a plurality of solenoid actuated valves with a 24 volt AC signal in accordance with the selected cycles and run times. In some cases the same electronic controller has the capability to both selectively energize landscape light fixtures and selectively energize solenoid actuated valves.

The typical electronic controller used with a landscape lighting system or an irrigation system includes a sheet metal or plastic box-like outer housing with a rear portion sometimes referred to as a back panel that is sealed by a front door hinged on a side of the rear portion of the outer housing. The control panel, power supply, electronic components, and wire connection terminals are mounted inside the outer housing. In the past, electronic irrigation controllers have been commercialized by Hunter Industries, Inc. that have included a control panel in the form of a removable face pack. The face pack can be mechanically disconnected from a frame and electrically disconnected from a ribbon cable connected to the rear portion of the outer housing to allow a person to walk around the irrigation site and program the cycles and run times for the various zones. See, for example, FIG. 25 of U.S. Pat. No. 7,457,687, assigned to Hunter Industries, Inc.

SUMMARY OF THE INVENTION

In accordance with the present invention a landscape controller housing includes a face pack that is pivotably and removably mounted in an outer housing. The face pack includes an enclosure with at least one manual input device mounted in a front side of the enclosure. A pair of pivot pins extend from a pair of opposite ends of the enclosure and at least one locking pin extends from an end of the enclosure and is spaced from one of the pivot pins. The outer housing defines an interior sufficiently large to enclose a chassis that supports the face pack. The chassis includes a pair of finger supports extending from a pair of opposite sides of the chassis. A pair of bearing slots each extends above one of the finger supports, and at least one lock recess extends below one of the finger supports. The bearing slots and the lock recess are dimensioned, configured and located within the chassis so that the face pack can be installed in the outer housing in a normal upright position in which the pivot pins are each received in a corresponding one of the bearing slots and the locking pin is received in the lock recess. The face pack can be swung through a predetermined angle to release the locking pin from the lock recess to allow the face pack to be removed from the outer housing by sliding the pivot pins out of the bearing slots and removing the locking pin from the lock recess. The face pack can be inserted into the outer housing into a substantially horizontal service position by sliding both the pivot pins and the locking pin into the bearing slots.

BRIEF DESCRIPTION OF THE DRAWINGS

Throughout the drawing figures, like reference numerals refer to like parts.

DETAILED DESCRIPTION

As used herein, the term "landscape controller" encompasses electronic controllers used in landscape lighting systems, electronic controllers used in irrigation systems, and electronic controllers that have dual functionality in that they can control both landscape light fixtures and irrigation valves.

It would be desirable to improve the mounting and removal of the face pack of a landscape controller. The face pack normally covers the terminals where the wires to the light fixtures and/or valves are connected. The face pack needs to be easily movable to allow access to the wiring terminals. The face pack also needs a place to be quickly and securely stored while the wiring is attached. The face pack also needs to be completely removable from the outer housing in simple fashion in order to allow a person to walk around the landscape site with the face pack in hand to enable more convenient and intuitive programming of the ON and OFF times for the light fixtures and/or irrigation zones.

Figure 3:
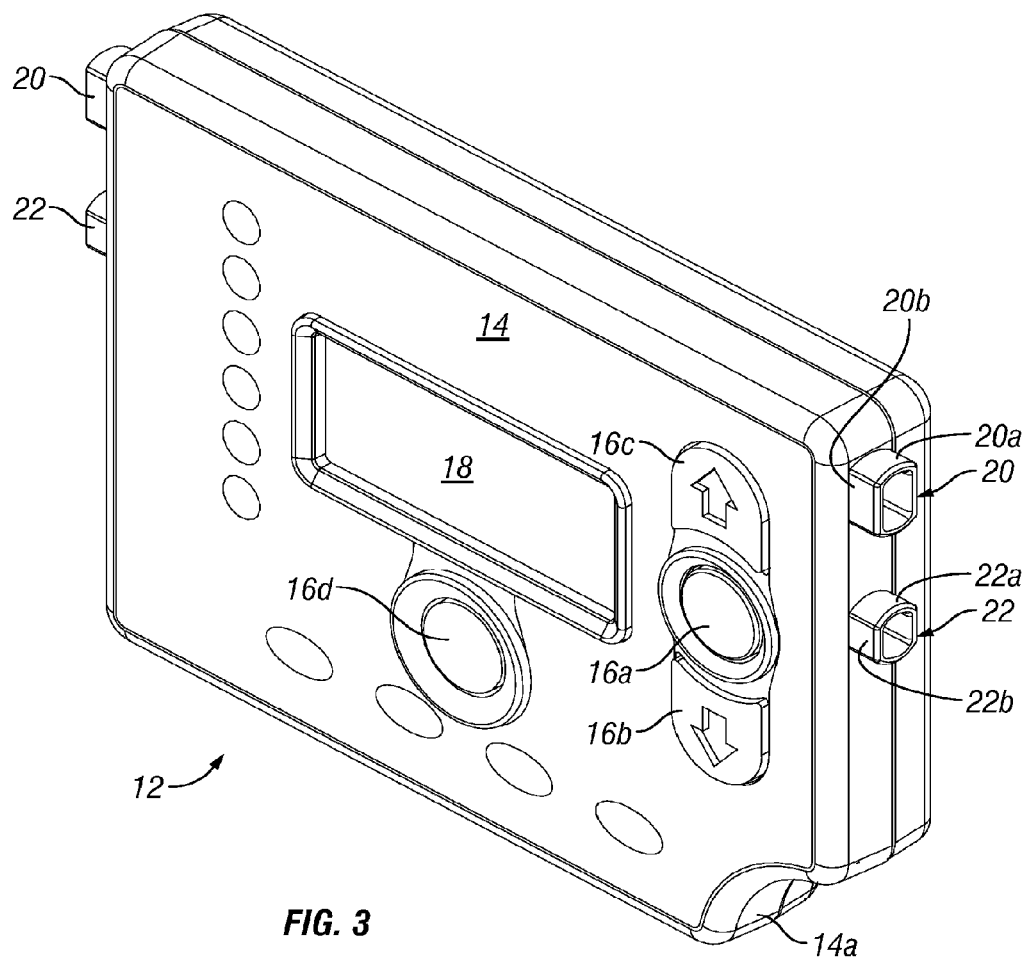
FIG. 3 is an enlarged isometric view of the face pack of the landscape controller of FIG. 1.
Figure 11A:
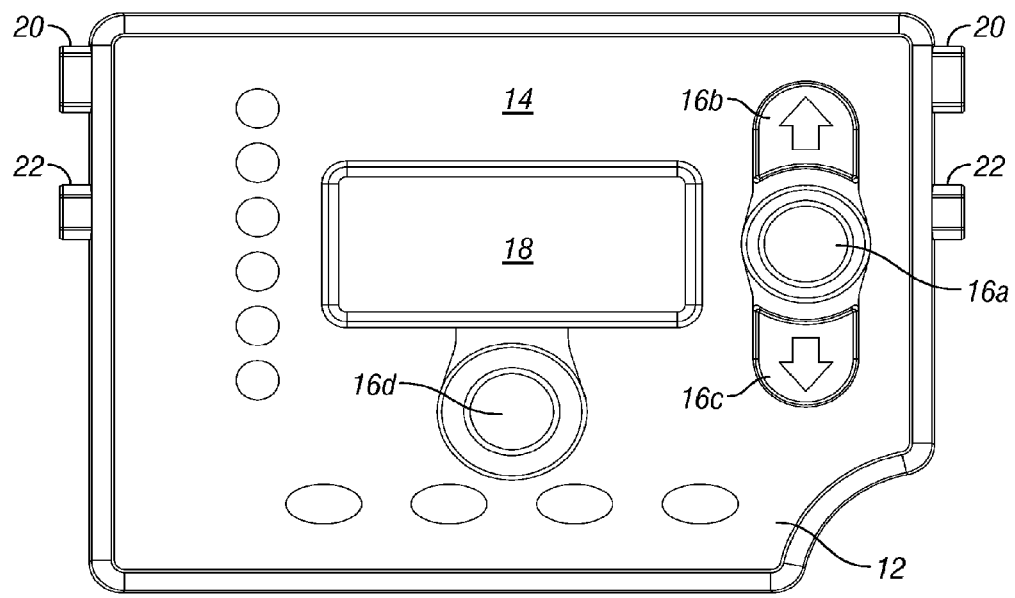
FIGS. 11A-11F are reduced front elevation, top plan, bottom plan, right side elevation, left side elevation, and rear elevation views, respectively, of the face pack illustrated in isometric view in FIG. 3.
Figure 11B:
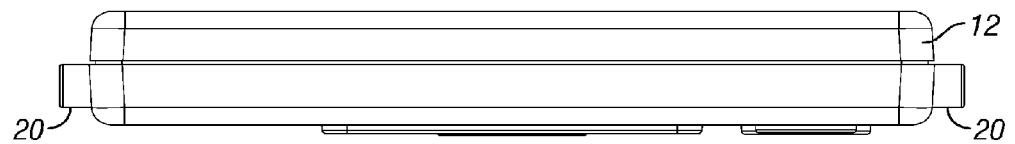
Figure 11C:
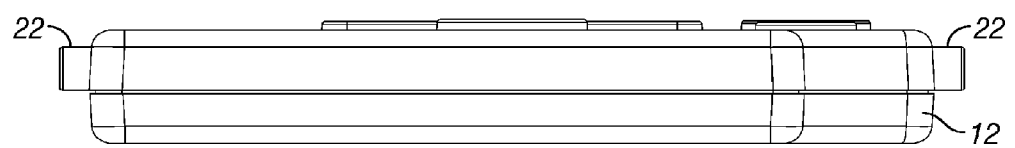
Figure 11D:
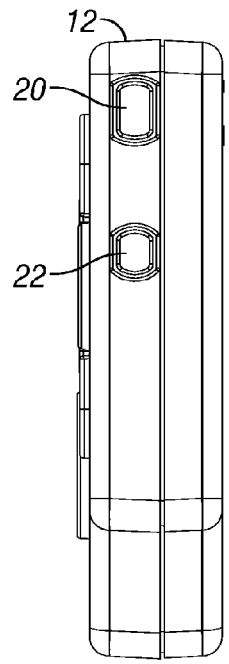
Figure 11E:
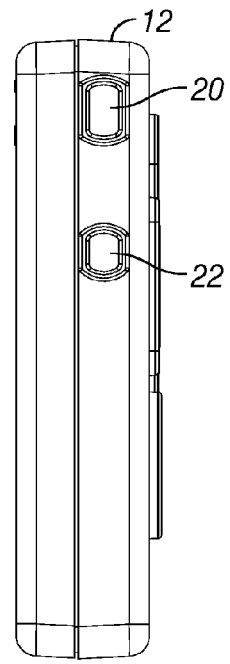

In accordance with an embodiment of the present invention, a landscape controller 10 (FIGS. 1A and 1B) is designed for supporting, holding and protecting the electronic control portion of a landscape lighting system. The landscape controller 10 includes a removable face pack 12. The face pack 12 (FIGS. 3 and 11A-11D) includes an injection molded plastic generally rectangular hollow enclosure 14 in which a PC board (not illustrated) is mounted. A plurality of manual input devices in the form of push buttons 16a-16d (FIGS. 3 and 11A) are mounted on a front side of the enclosure 14. An LCD display 18 is also mounted in the front of the enclosure 14.

A pair of pivot pins 20 (FIGS. 3 and 11A) extend from the opposite ends of the enclosure 14. A pair of locking pins 22 extend from the opposite ends of the enclosure 14 and are spaced from and situated below the pivot pins 20. The pivot pins 20 and the locking pins 22 extend along parallel axes from the opposite ends of the face pack enclosure 14. The pivot pins 20 and the locking pins 22 are preferably integrally molded with the top half of the face pack enclosure 14. The pivot pins 20 are hollow and have an identical truncated cylindrical configuration including a pair of opposing cylindrical outer surfaces 20a (FIG. 3) and a pair of opposing flat surfaces 20b. Similarly, the locking pins 22 are hollow and have an identical truncated cylindrical configuration including a pair of opposing cylindrical outer surfaces 22a (FIG. 3) and a pair of opposing flat surfaces 22b.

Figure 1A:
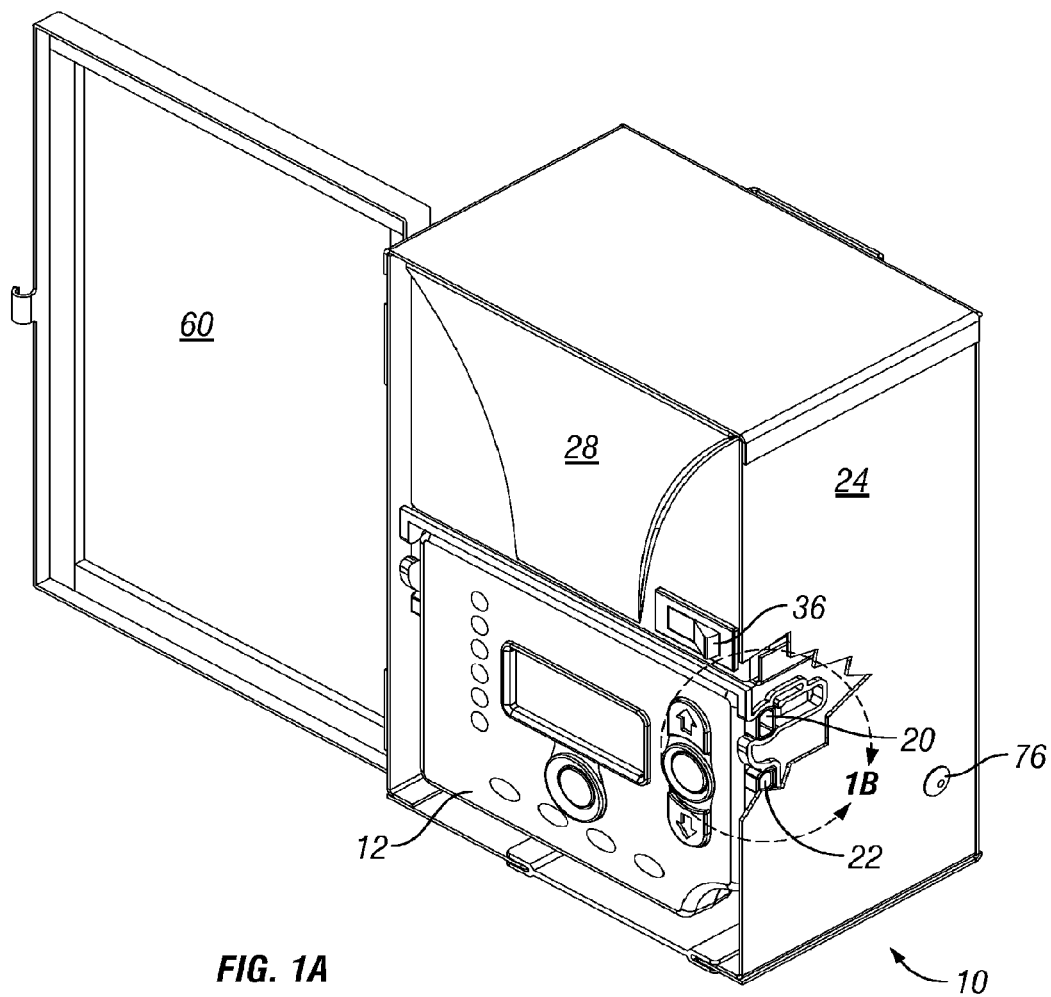
FIG. 1A is an isometric view of a landscape controller in accordance with an embodiment of the present invention with its front door open to reveal its removable face pack in its normal lowered (upright) position. A portion of the right side of the outer housing is broken away to reveal the pivot pin, locking pin and support finger that allow the face pack to rotate.
Figure 10A:
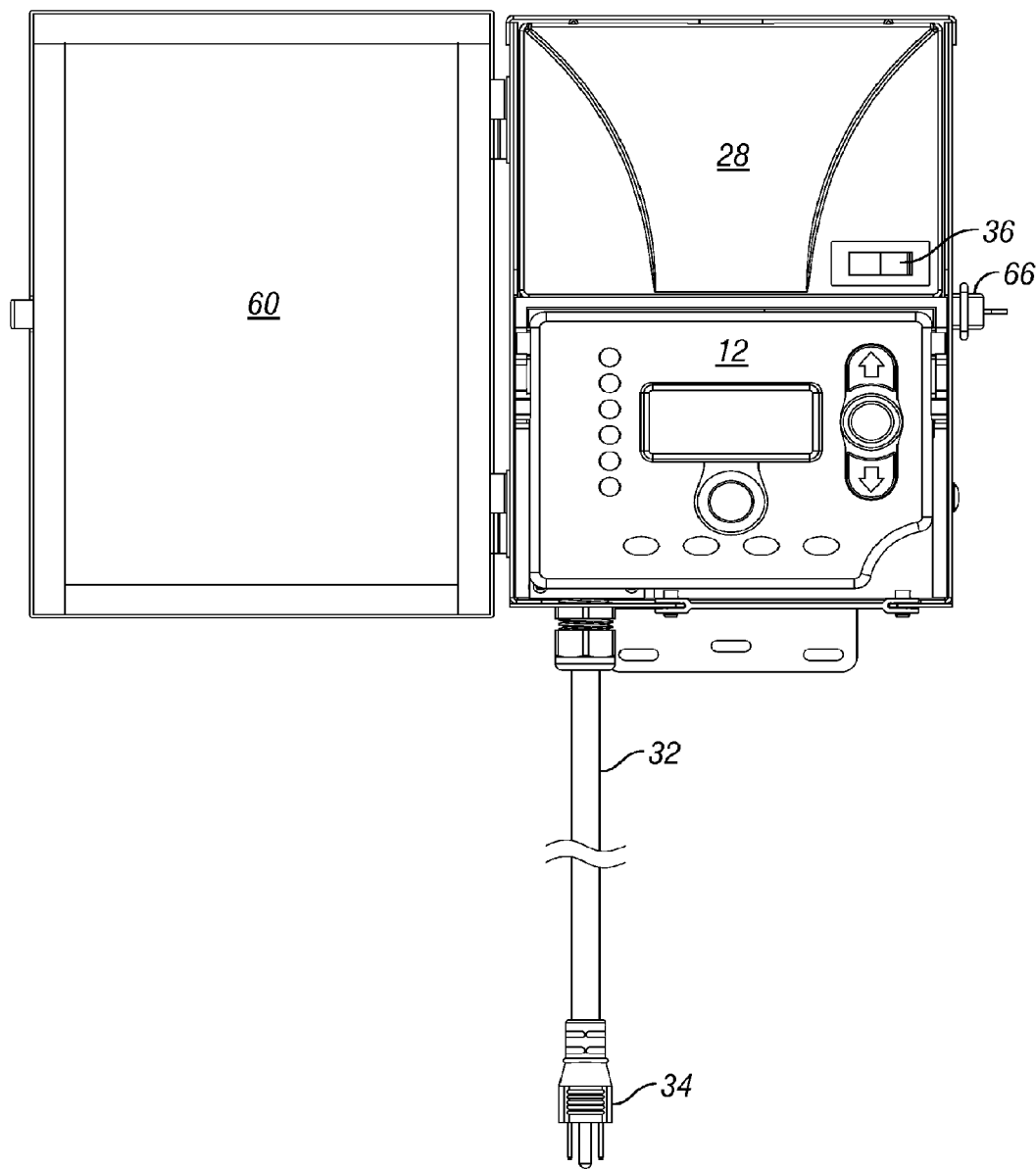
FIGS. 10A-10D are reduced front elevation, top plan, bottom plan, and right side elevation views, respectively, of the landscape controller of FIG. 1.
Figure 10B:
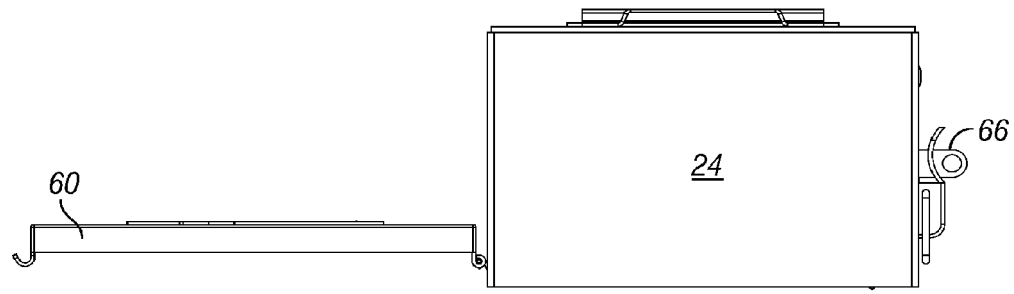
Figure 10C:
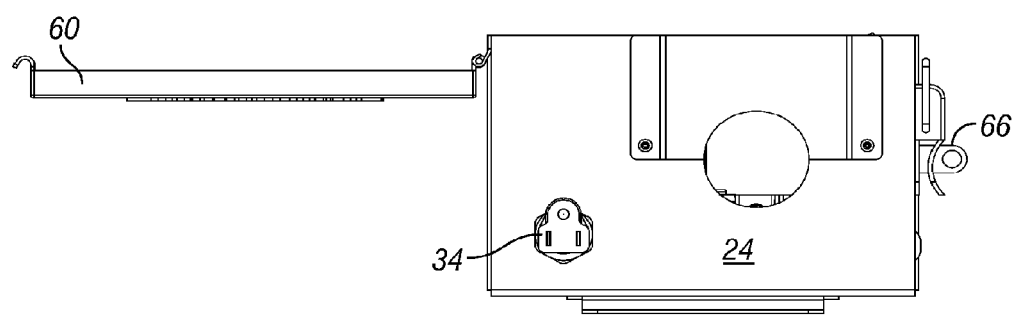

The landscape controller 10 further includes a generally rectangular box-like outer housing comprised of a rear portion 24 (FIG. 1A) and a front door 60 that is hinged to a left side of the rear portion 24. The rear housing portion 24 and the front door 60 are both preferably made of sheet metal. The rear outer housing portion 24 defines an interior sufficiently large to enclose the face pack 12 in a lower half thereof. The upper half of the interior of the rear housing portion 24 encloses a power supply 26 (FIG. 12) behind a decorative panel 28 (FIG. 1A). The power supply 26 is connected to an AC power source 30 (FIG. 12) such as standard 110 volt AC outlet via a power cord 32 (FIG. 10A) and standard grounded AC male plug 34. An ON/OFF rocker switch 36 (FIG. 1A) is mounted in the decorative panel 28 and may be manually actuated to connect and disconnect the power supply 26 relative to the AC power source 30.

Figure 1B:
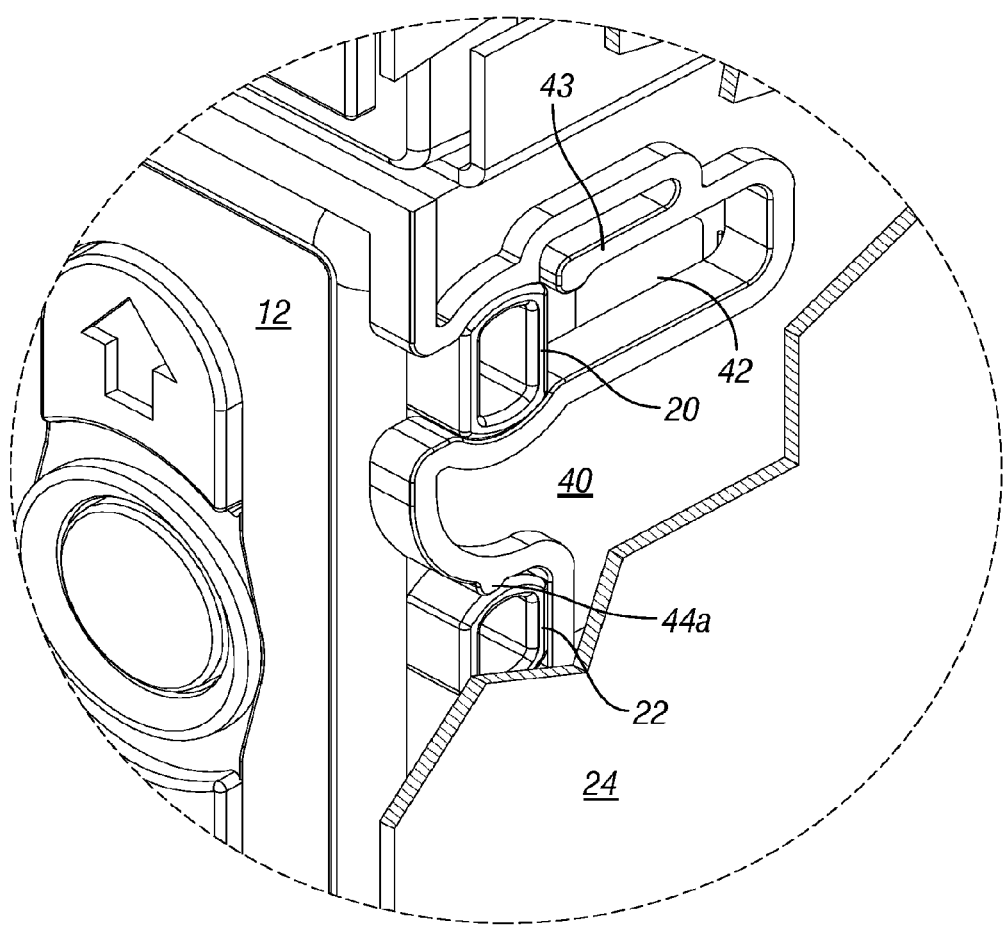
FIG. 1B is an enlarged portion of FIG. 1A illustrating details of the engagement of the pivot pin, locking pin and support finger when the face pack is in its normal lowered (upright) position.
Figure 6A:
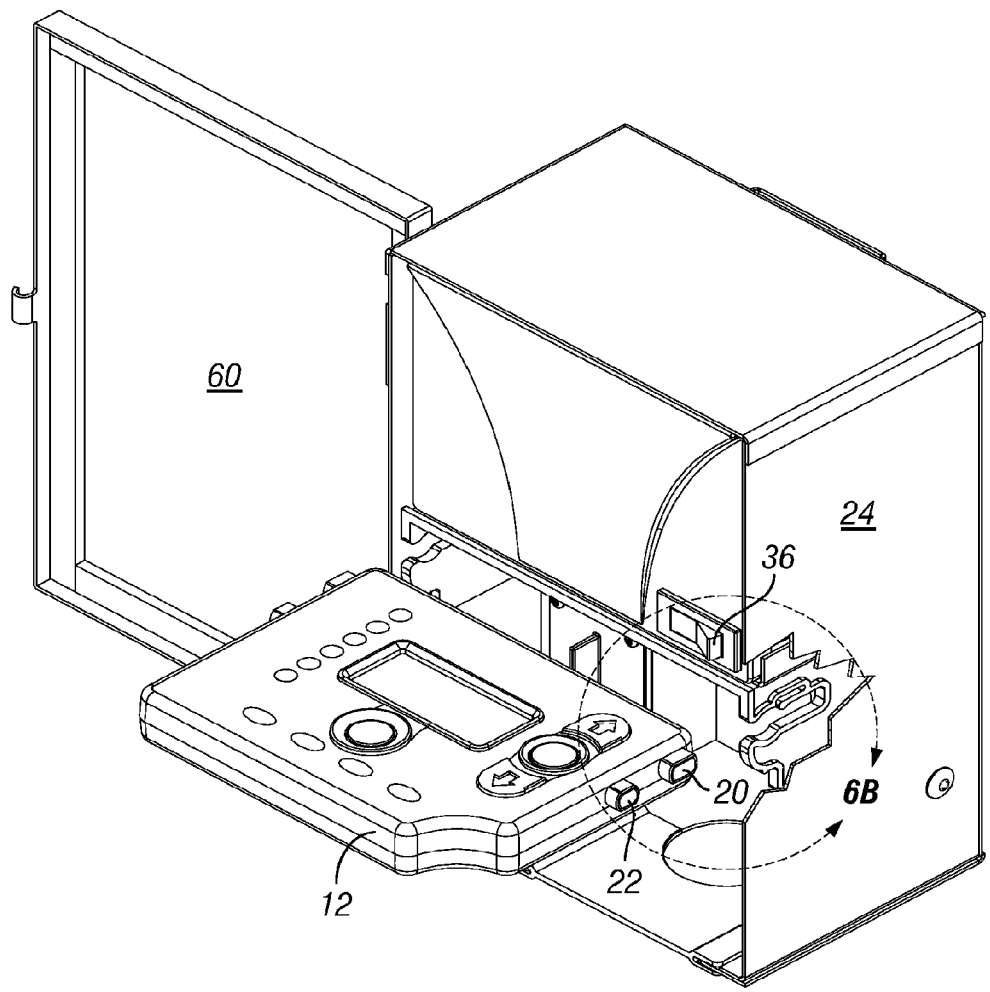
FIG. 6A is a view similar to FIG. 5A illustrating the face pack rotated to a horizontal position and removed from the outer housing.
Figure 7A:
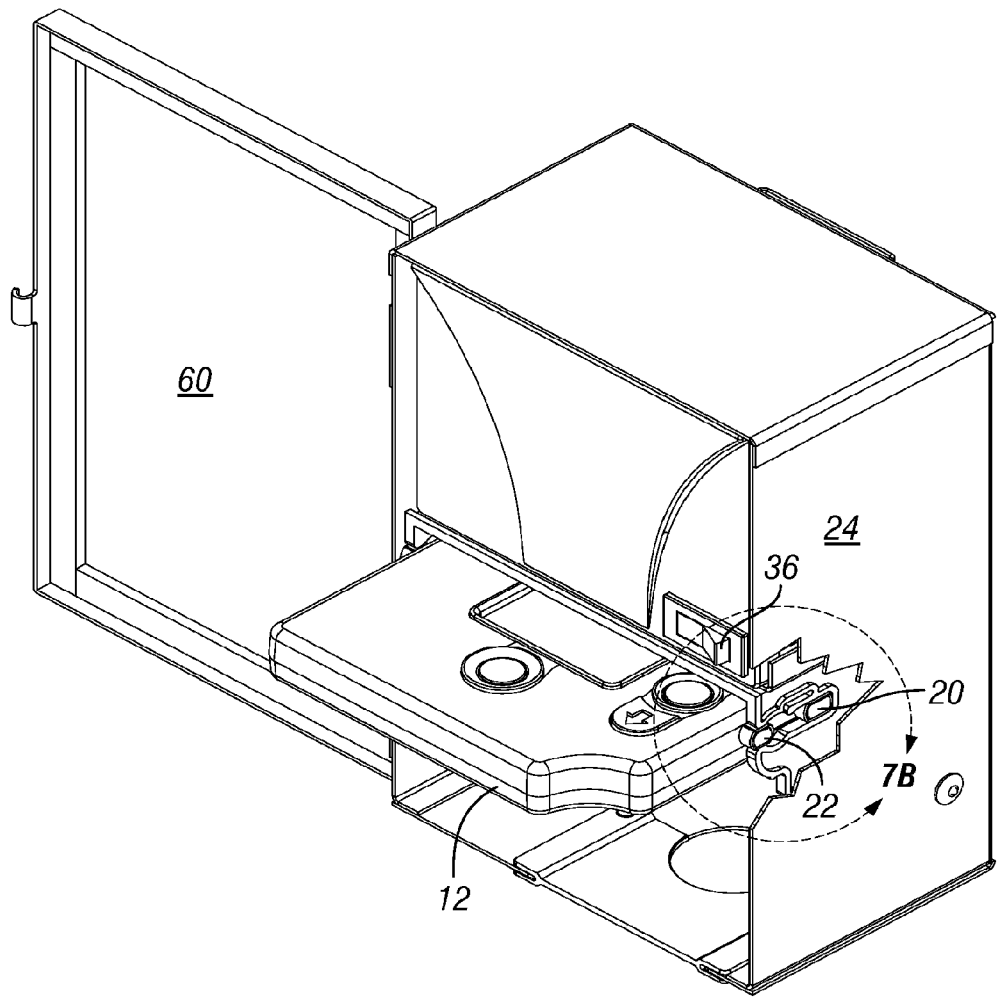
FIG. 7A is a view similar to FIG. 6A illustrating the face pack pushed rearwardly into the outer housing in a horizontal service position.
Figure 7B:
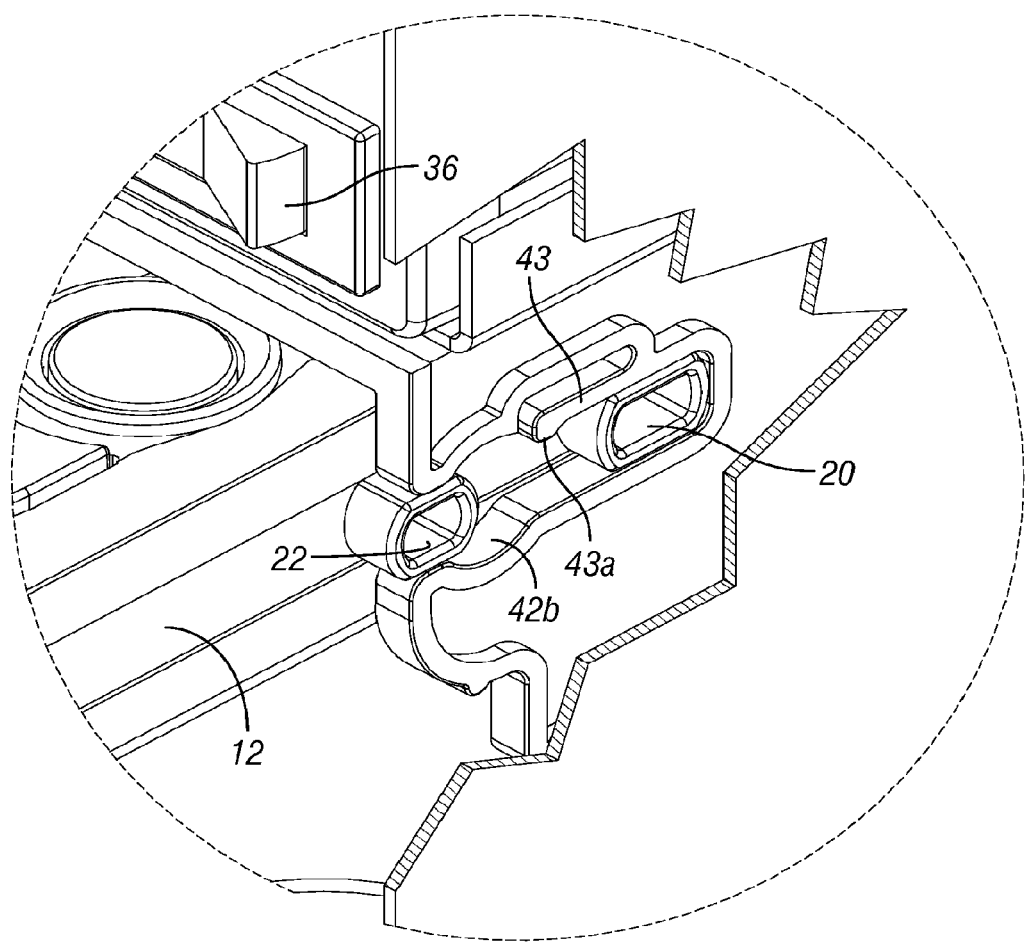
FIG. 7B is an enlarged portion of FIG. 7A illustrating details of the engagement of the pivot pin, locking pin and support finger when the face pack is pushed rearwardly into the outer housing into its horizontal service position.
Figure 9A:
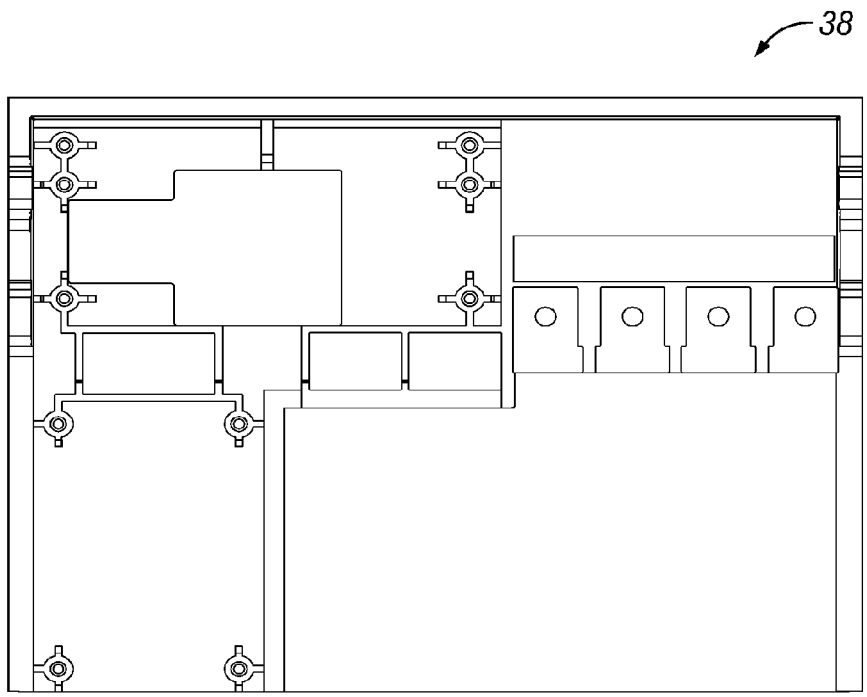
FIGS. 9A-9D are front elevation, bottom plan, rear elevation and side elevation views, respectively, of the internal chassis of the landscape controller of FIG. 1.
Figure 9B:
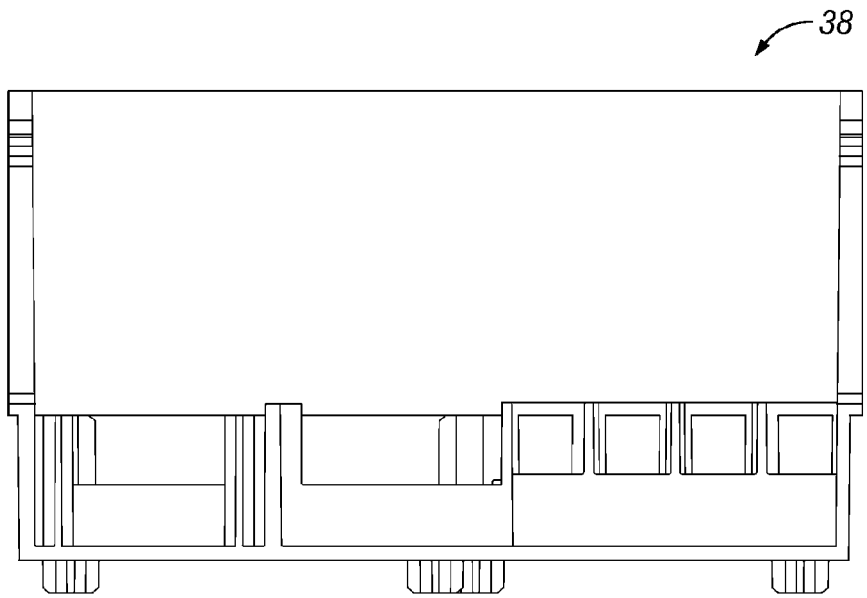
Figure 9C:
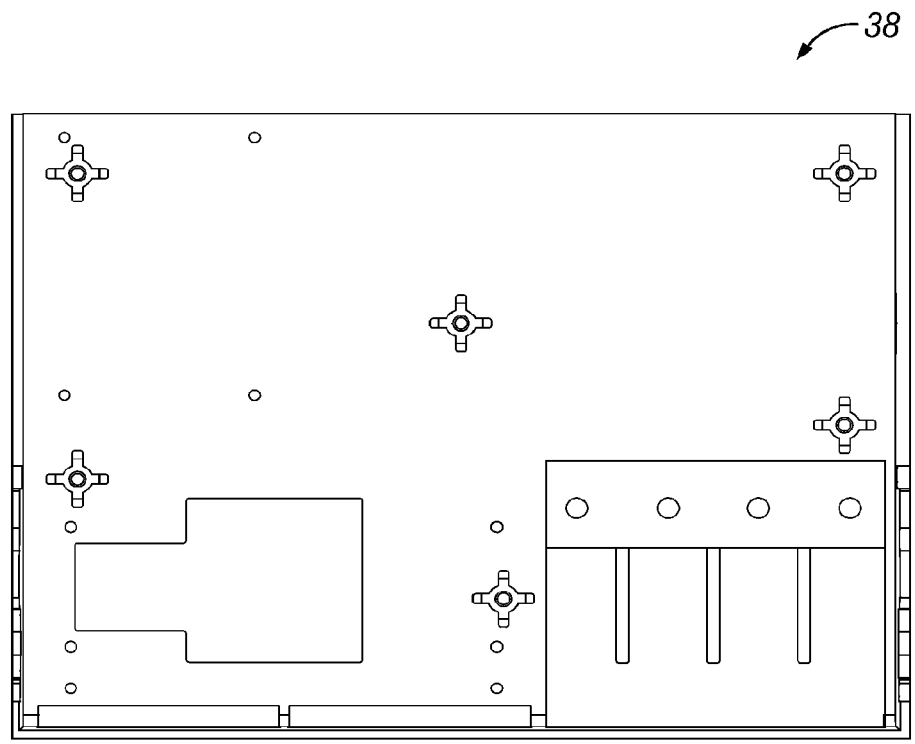
Figure 9D:
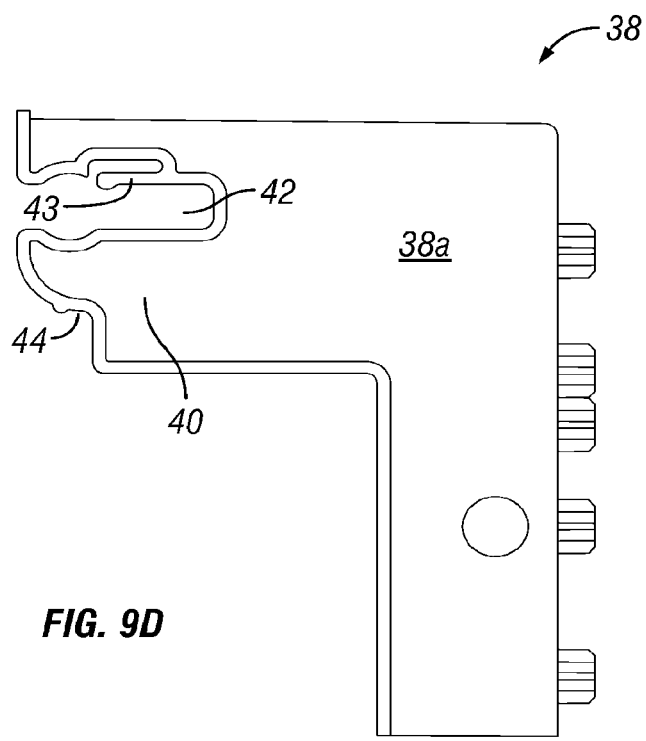

An injection molded plastic generally rectangular chassis 38 (FIGS. 9A-9D) is securely attached to the lower half of the rear housing portion 24. The chassis 38 has a pair of identical inverted L-shaped side walls 38a (FIG. 9D) and therefore only the one side wall 38a need be hereafter described. The side wall 38a includes a horizontally extending finger support 40. A bearing slot 42 formed in the side wall 38a extends horizontally above the finger support 40. A flexible arm 43 extends horizontally in the upper portion of the bearing slot 42. A lock recess 44 is formed in the side wall 38a below the finger support 40. Thus the chassis 38 provides pair of vertically aligned fingers 40, bearing slots 42, flexible arms 43, and lock recesses 44. The bearing slots 42 and the lock recesses 44 are dimensioned, configured and located within the rear housing portion 24 so that the face pack 12 can be installed in the rear housing portion 24 in a normal upright position (FIG. 1A). When the face pack 12 is in its normal upright position the pivot pins 20 are each received in a corresponding one of the bearing slots 42 and the locking pins 22 are each received in a corresponding one of the lock recesses 44 as best seen in FIG. 1B. The bearing slots 42 and the lock recesses 44 are also dimensioned, configured and located within the rear housing portion 24 so that the face pack 12 can be swung through a predetermined angle to release the locking pins 22 from the lock recesses 44 to allow the face pack 12 to be removed from the rear housing portion 24 as illustrated in FIG. 6A. This is accomplished by removing the locking pins 22 from the lock recesses 44 and sliding the pivot pins 20 out of the bearing slots 42. The face pack 12 can be inserted back into the rear housing portion 24 by sliding the pivot pins 20 back into the bearing slots 42. The face pack 12 can be placed into a horizontal service position illustrated in FIG. 7A by rotating the face pack 12 to a horizontal orientation and sliding both the pivot pins 20 and the locking pins 22 into the bearing slots 42 until the pivot pins 20 engage the terminal end walls of the bearing slots 42.

Figure 11F:
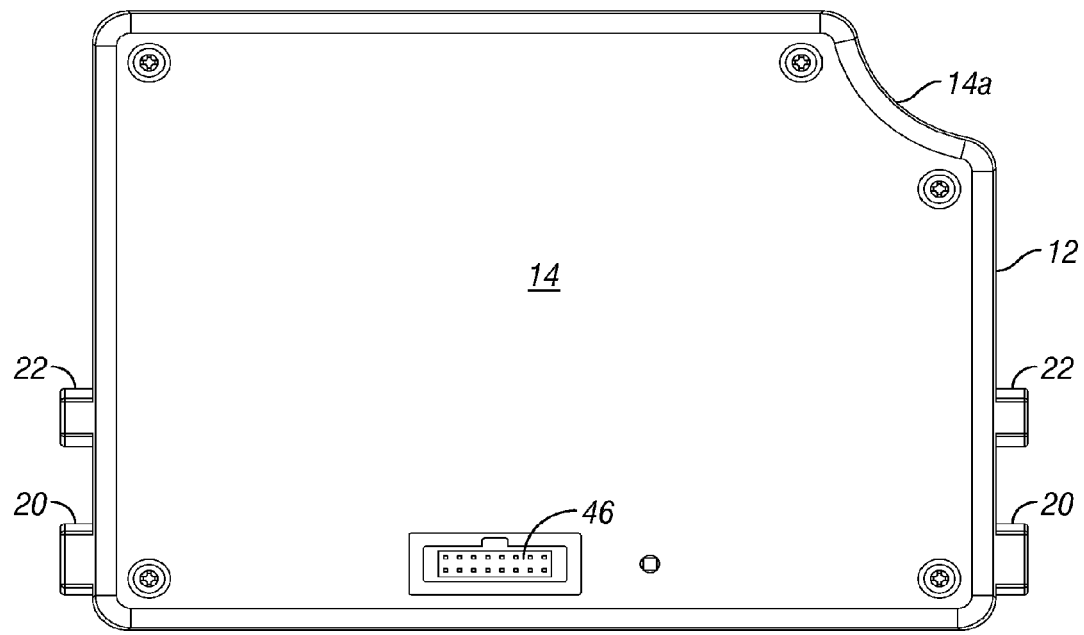

The landscape controller 10 further includes a first multi-pin male electrical connector 46 (FIG. 11F) mounted in the rear of the face pack enclosure 14. This connector is mounted on the PC board (not illustrated) inside the face pack enclosure 14 and protrudes through an aperture in the face pack enclosure 14. A second multi-pin male electrical connector 48 (FIG. 8) is mounted in the rear housing portion 24. A ribbon cable 50 (FIG. 12) has mating female multi-contact electrical connectors at each end that can be plugged into the multi-pin male electrical connectors 46 and 48 to provide power to the face pack 12 and to allow the face pack to turn light fixtures ON and OFF using the power in the power supply 26. The face pack 12 can be readily removed from the rear housing portion 24 and the ribbon cable 50 disconnected from the face pack 12. This allows a person to walk around the landscape site with the face pack 12 in hand to enable more convenient and intuitive programming of the ON and OFF times for the light fixtures of the landscape lighting system. The face pack 12 includes a battery 56 (FIG. 12) that supplies power to its micro-controller 58 and LCD display 18 when incoming power, or the ribbon cable 50 is disconnected.

Figure 2:
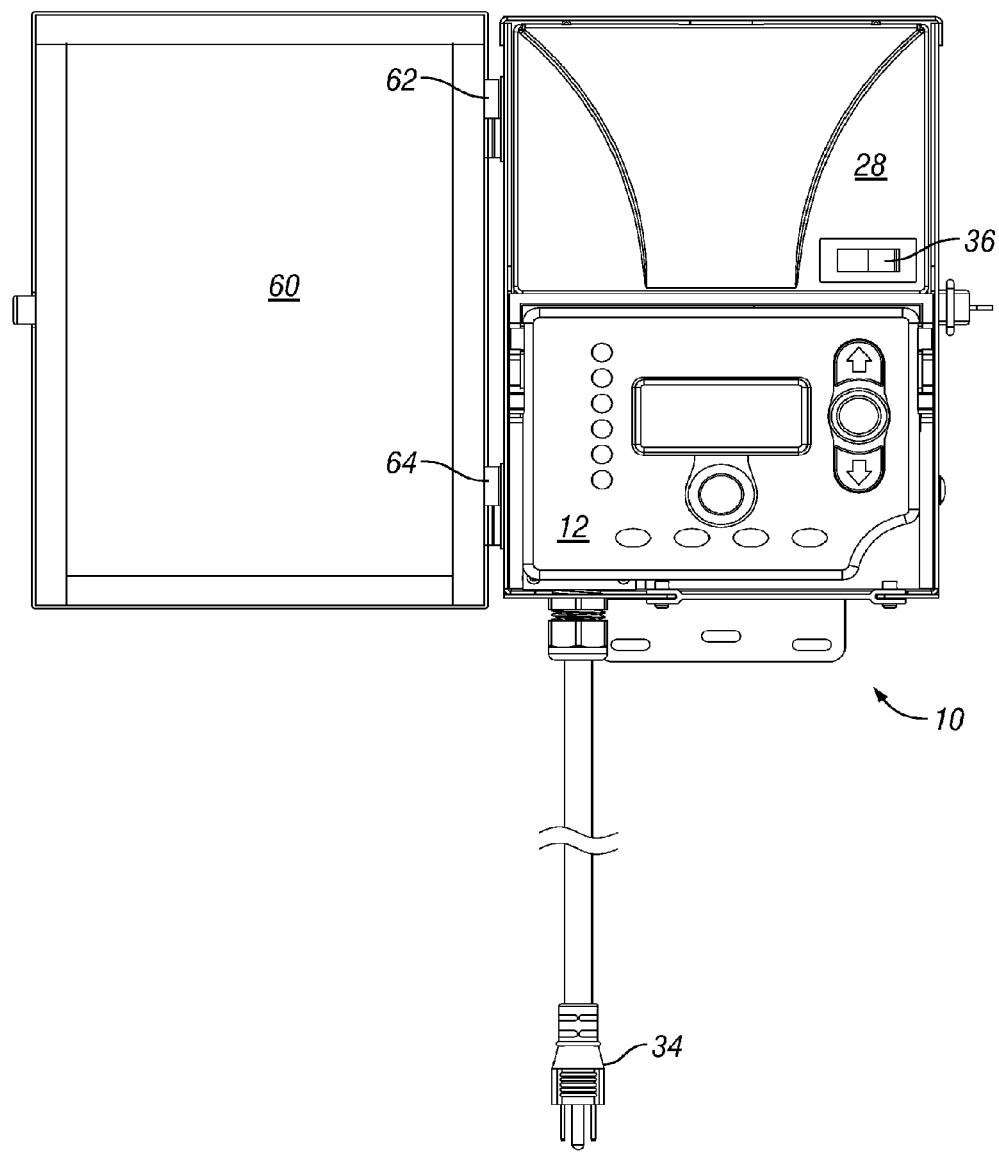
FIG. 2 is a front elevation view of the landscape controller of FIG. 1.
Figure 10D:
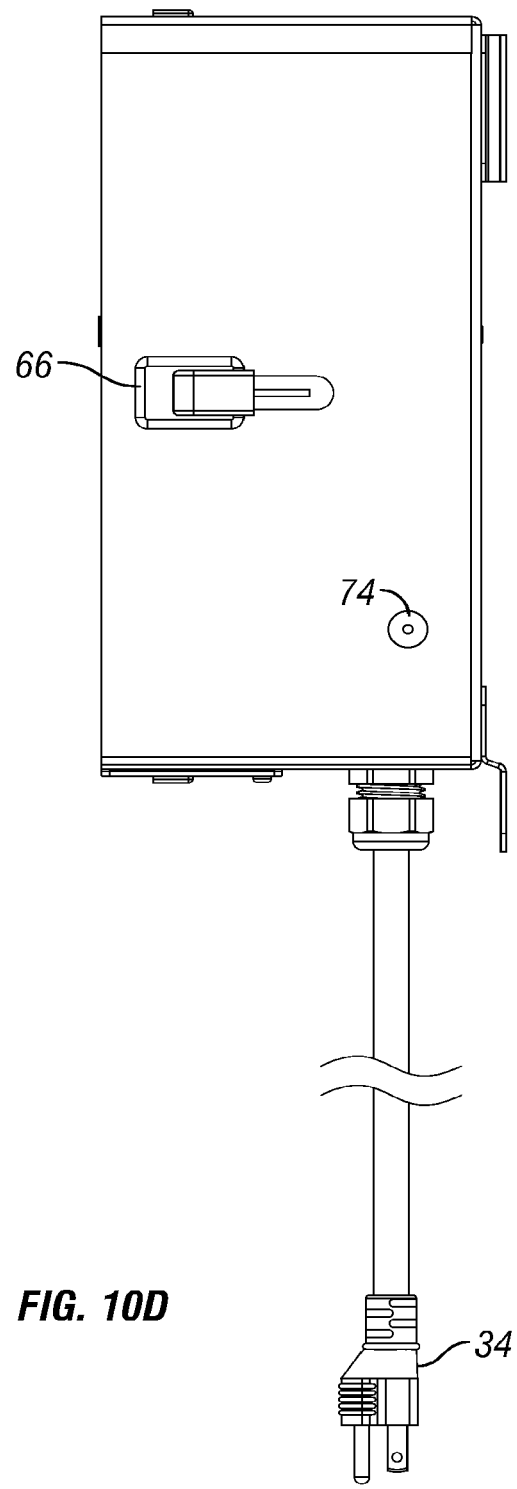

The sheet metal door 60 (FIGS. 1A and 2) is dimensioned to cover the front opening defined by the interior of the sheet metal rear housing portion 24. A hinge assembly that includes a pair of hinges 62 and 64 (FIG. 2) connects a side edge of the door 60 and a side edge of the rear housing portion 24. The door 60 can be closed and secured with a clasp lock 66 (FIGS. 8 and 10D) to protect the electrical components inside.

Figure 4A:
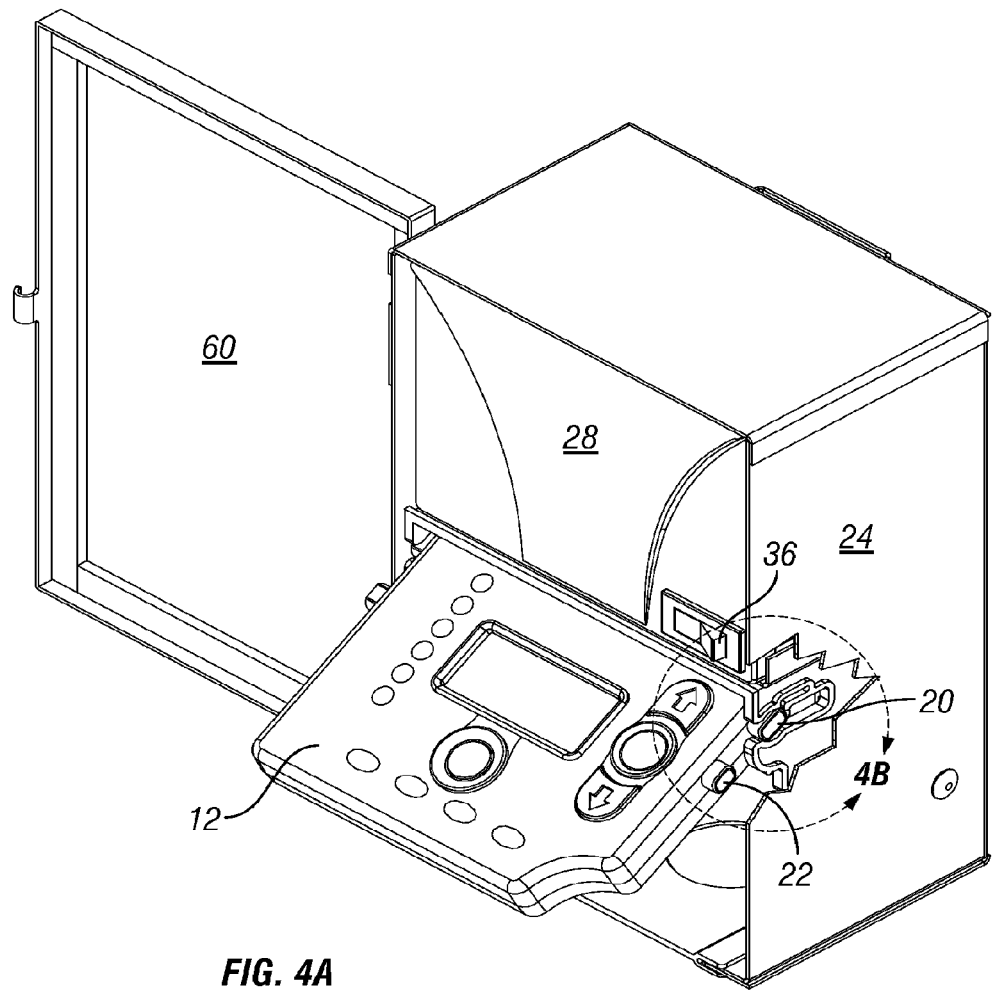
FIG. 4A is a view similar to FIG. 1 illustrating the face pack partially rotated inside the outer housing.
Figure 4B:
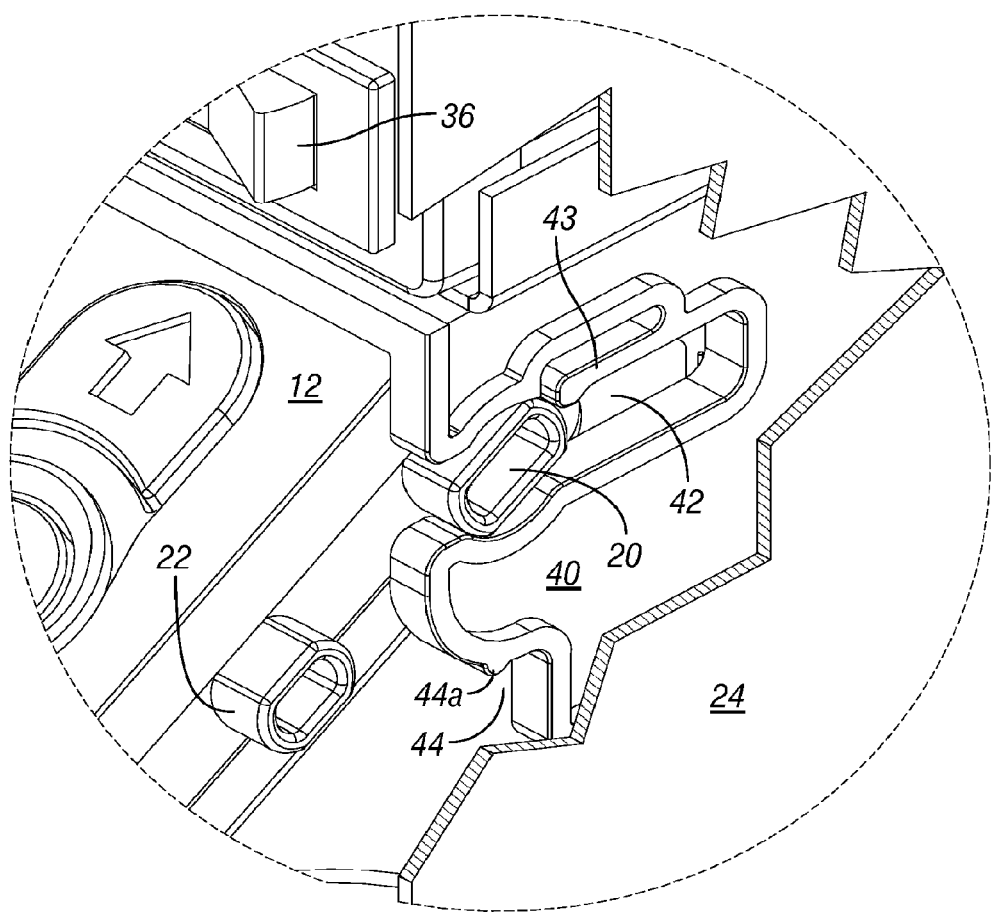
FIG. 4B is an enlarged portion of FIG. 4A illustrating details of the engagement of the pivot pin, locking pin and support finger when the face pack is partially rotated.
Figure 5A:
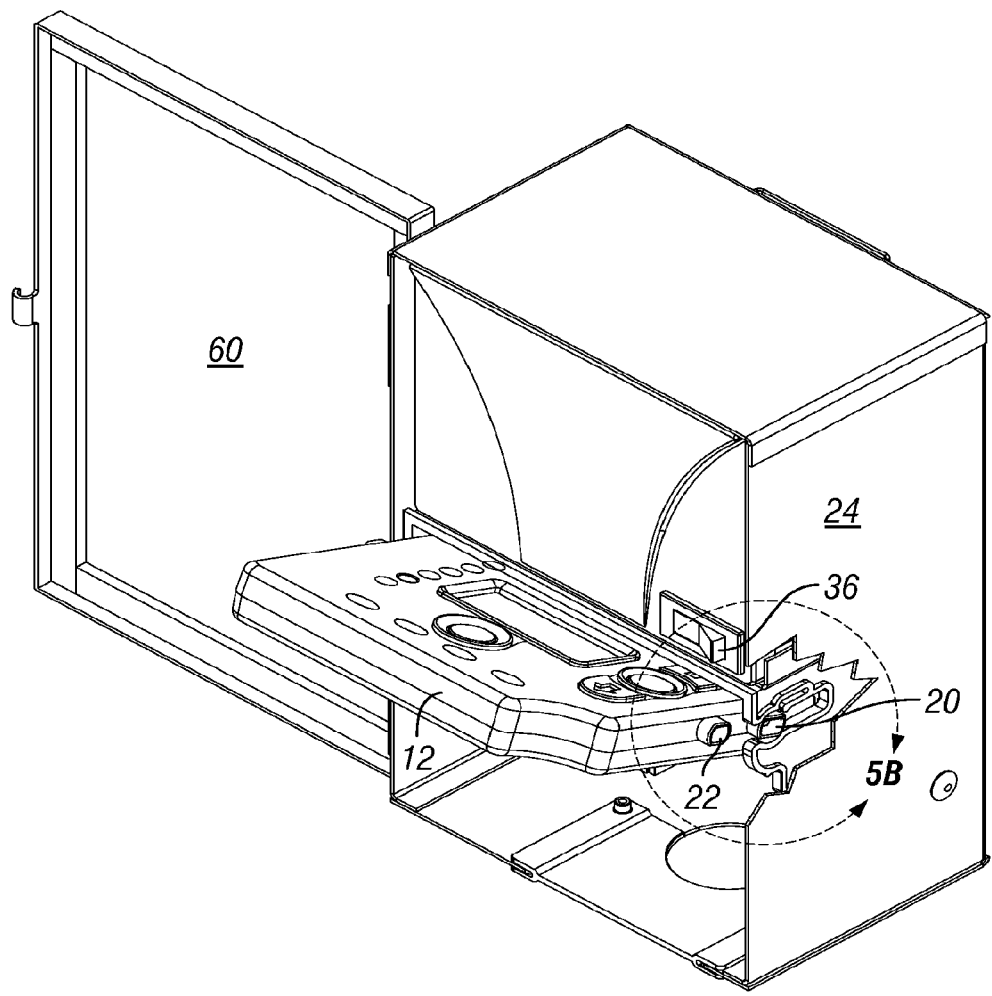
FIG. 5A is a view similar to FIG. 4A illustrating the face pack further rotated past a horizontal position.
Figure 5B:
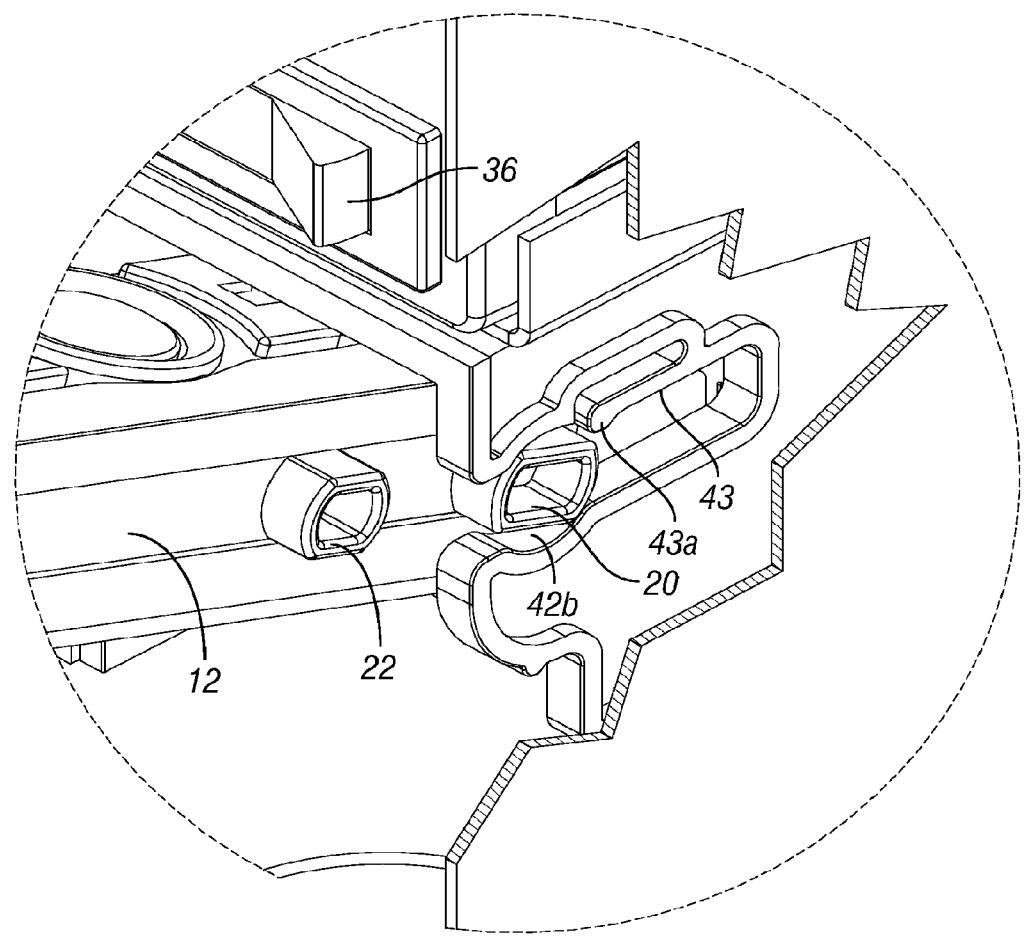
FIG. 5B is an enlarged portion of FIG. 5A illustrating details of the engagement of the pivot pin, locking pin and support finger when the face pack is rotated past its horizontal position.

The wall of the lock recess 44 in each chassis side wall 38a has a projection or locking nub 44a (FIG. 4B) formed thereon which deflects upwardly to permit the locking pin 22 to pass by the locking nub 44a and thereafter returns to its original position to retain the locking pin 22 in the lock recess 44. When the pivot pins 20 of the face pack 12 are situated in their pivot positions in the bearing slots 42 downward manually applied force on the lower portion of the face pack 12 forces the locking pins 22 past the locking nubs 44a. The face pack enclosure 14 is formed with a curved cut-out region or relief 14a (FIG. 3) at its lower right hand corner into which a user can inert their finger in order to pivot the face pack 12 outwardly to force the locking pins 22 past the locking nubs 44a and out of the lock recesses 44 to allow the face pack 12 to be pivoted upwardly as illustrated in FIG. 4A.

Figure 6B:
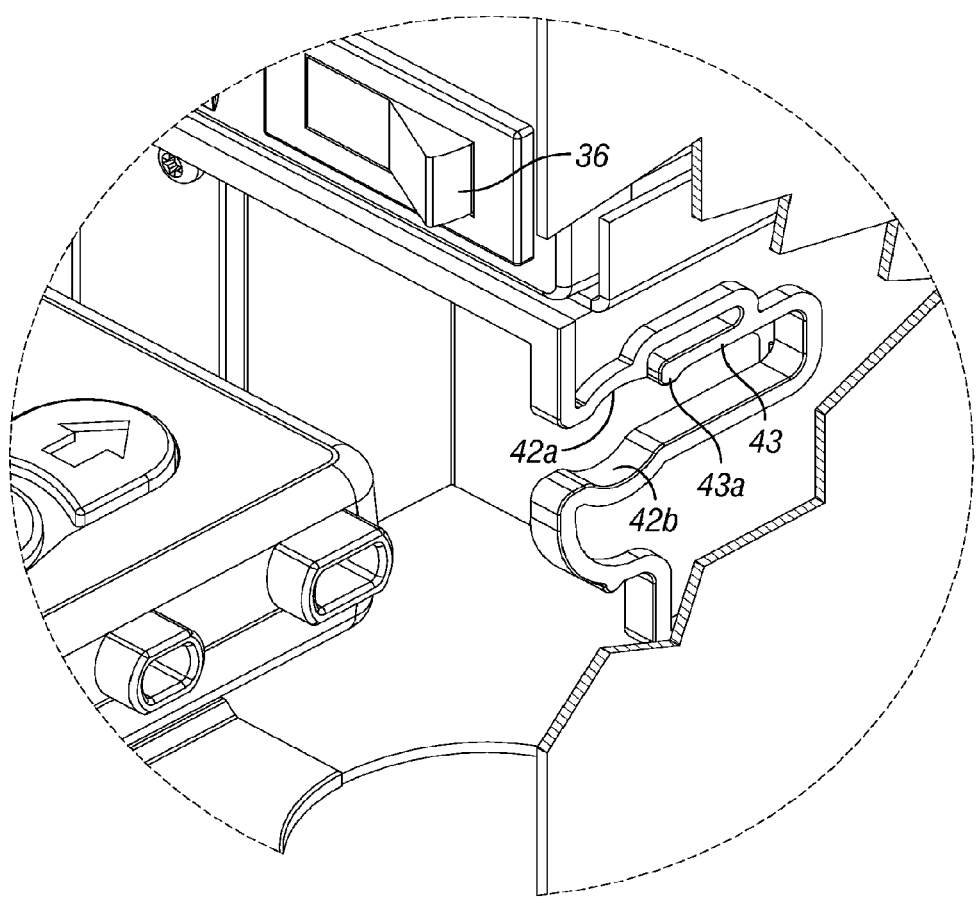
FIG. 6B is an enlarged portion of FIG. 6A illustrating details of the pivot pin, locking pin and support finger visible when the face pack is removed from the outer housing.

The bearing slot 42 in each chassis side wall 38a is formed with a pair of opposing arcuate walls 42a and 42b (FIG. 6B) that engage and support the opposing cylindrical surfaces 20a (FIG. 3) of the pivot pins 20. The arcuate walls 42a and 42b thus define a pivot position along the bearing slot 42. The flexible arm 43 has an enlarged lobe 43a at its distal end that engages the pivot pin 20 and keeps the pivot pin 20 in its pivot position when the face pack 12 is being swung up or down. During this operation, the locking pins 22 are not engaged with the chassis 38 except when the face pack 12 is nearly vertical.

Figure 8:
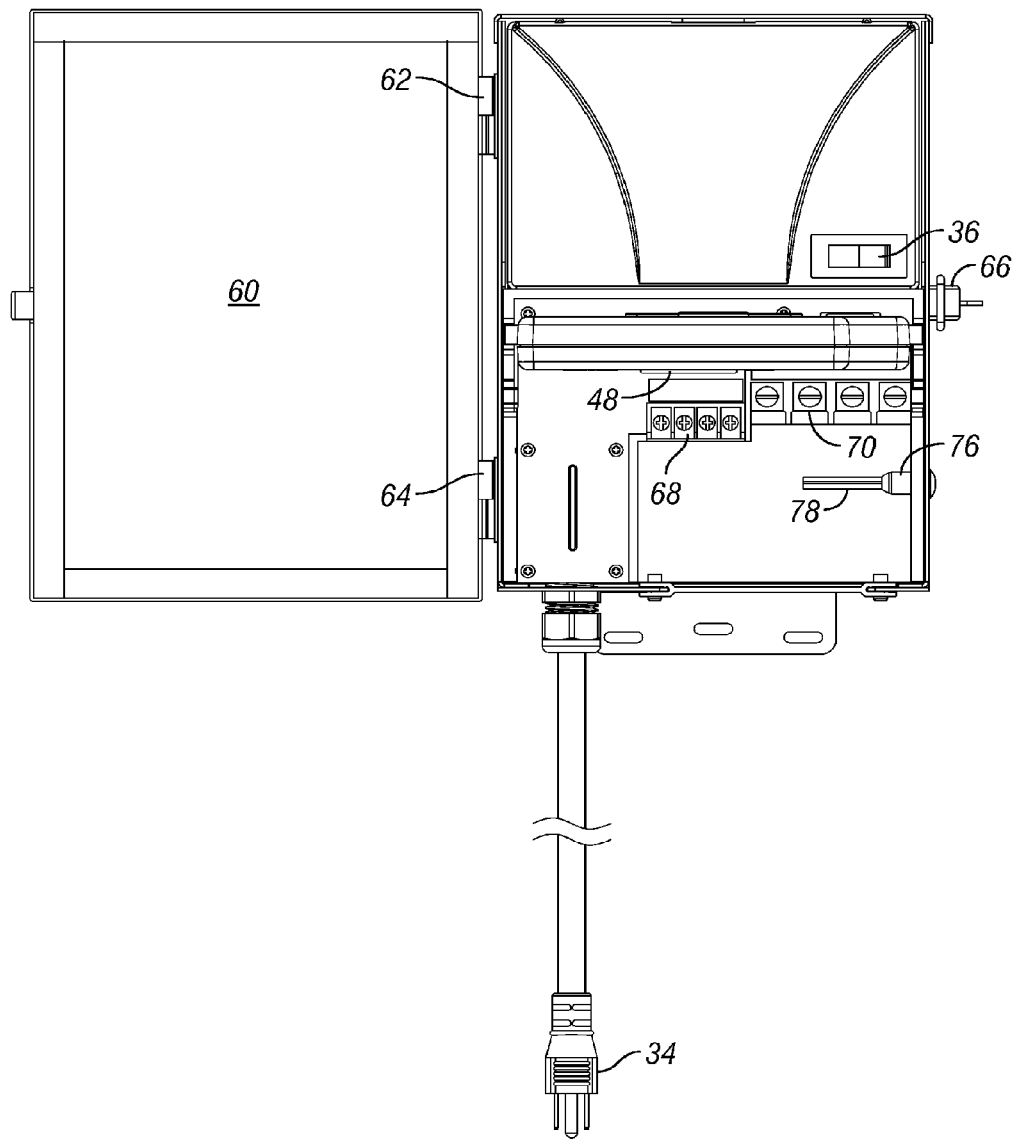
FIG. 8 is a front elevation view of the landscape controller of FIG. 1 when the face pack is pushed rearwardly into the outer housing into its horizontal service position.
Figure 12:
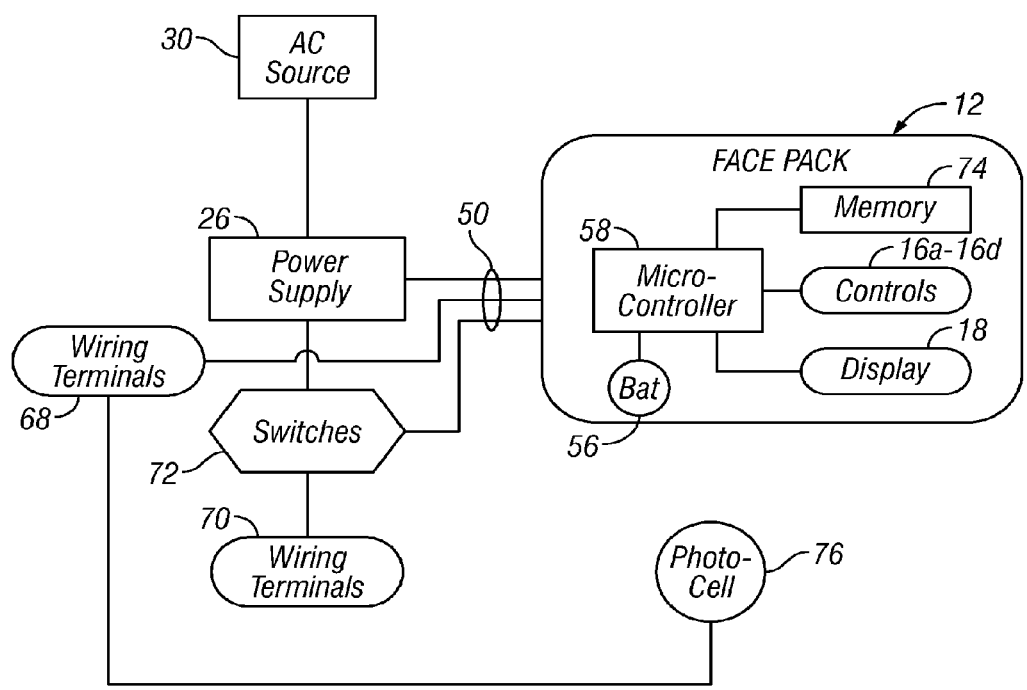
FIG. 12 is a block diagram of the electronic components of the landscape controller of FIG. 1.

The landscape controller 10 includes a first plurality of wire connection terminals 68 (FIG. 8) and a second plurality of screw-type wire connection terminals 70. Both sets of wire connection terminals 68 and 70 are mounted in the chassis 38. The wire connection terminals 68 and 70 are normally concealed behind the face pack 12 when the face pack 12 is installed in the outer housing 24 in its normal upright position. The wire connection terminals 68 and 70 are accessible for manually connecting wires to the wire connection terminals 68 and 70 when the face pack 12 is in its horizontal service position. The terminals 68 can be used to connect wires from various sensors, such as a photo cell 76 (FIG. 12). FIG. 8 illustrates a two-conductor cable 78 connected to the photo cell 76 mounted in the right side wall of the rear housing portion 24 which is connected to terminal 68. The remaining terminals 68 provide auxiliary inputs to allow another device to turn on the lights if desired. The wire connection terminals 70 are used to attach wires that lead to the light fixtures (not illustrated). One of the wire connection terminals 70 provides a common return connection.

When the face pack 12 is horizontally stored in the rear housing portion 24, the user can quickly slide it out of the rear housing portion 24. Because the pivot pins 20 and the locking pins 22 have flat surfaces 20b and 22b, respectively, the face pack 12 can be readily inserted horizontally into the rear housing portion 24 into its service position by sliding both the pivot pins 20 and the locking pins 22 fully into the bearing slots 42. The pivot pins 20 push on the lobes 43a (FIG. 6B) on the distal ends of the arms 43, causing the arms 43 to flex upwardly and allow the pivot pins 20 to slide past the lobes 43a. The lower walls of the bearing slots 42 support the pivot pins 20 and the locking pins 22 to maintain the face pack 12 in its horizontal orientation. When the face pack 12 is horizontal the user may remove it completely from the rear housing portion 24 as explained above. The bearing slots 42 form a storage compartment for the face pack 12 to allow the user to perform wiring and de-bugging functions with both hands as the face pack 12 will stay in its raised horizontal position without manual assistance.

FIG. 12 is a block diagram of the electronic components of the landscape controller of FIG. 1. The power supply 36 is mounted in the upper half of the rear housing portion 24 and the removable face pack 12 is mounted in the lower half of the rear housing portion 24. The ribbon cable 50 provides the conductive paths for the face pack 12 to receive power from the power supply 26 and selectively energize the light fixtures (not illustrated) via a plurality of solid state switches 72. The face pack includes a memory 74 for storing a lighting program entered via the manual controls 16a-16d with the assistance of alphanumeric codes and graphic symbols indicated on the display 18. The photo cell 76 is connected via the terminals 68 and the ribbon cable 50 to the face pack 12 and the lighting program stored in the memory 74 may adjust the ON or OFF times based on detection of dusk and dawn.

While I have described an embodiment of my landscape controller housing in detail, modifications and adaptions thereof will occur to those skilled in the art. Only a single locking pin 22 and corresponding lock recess 44 are needed. My invention can be used to house the electronic components of a landscape lighting system, the electronic components of an irrigation control system, or both. It is believed that the claims set forth hereafter do not require enablement in terms of electronics. Nevertheless, the entire disclosures of the following published U.S. patent applications are hereby incorporated by reference, namely, Pub. No. 2010/0084985 of Peter J. Woytowitz entitled "Low Voltage Outdoor Lighting Power Source and Control System" and Pub. No. 2010/0094472 of Peter J. Woytowitz et al. entitled "Irrigation System with Soil Moisture Based Seasonal Watering Adjustment." Both of the aforementioned applications are assigned to Hunter Industries, Inc., the assignee of the subject application. The protection afforded the present invention should only be limited in accordance with the following claims.

I claim:

1. A landscape controller housing, comprising:
   a face pack including an enclosure, at least one manual input device mounted in a front side of the enclosure, a pair of pivot pins extending from a pair of opposite ends of the enclosure, and at least one locking pin extending from an end of the enclosure and spaced from one of the pivot pins; and
   an outer housing defining an interior sufficiently large to enclosure the face pack, the outer housing enclosing a chassis having a pair of bearing slots each on opposite sides of the chassis, the bearing slots being configured such that the face pack can be installed in the outer housing in a normal upright position in which the pivot pins are each received in a corresponding one of the bearing slots, the face pack can be swung through a predetermined angle to allow the face pack to be removed from the outer housing by sliding the pivot pins out of the bearing slots, and the face pack can be inserted into the outer housing into a substantially horizontal service position by sliding both the pivot pins and the locking pin into the bearing slots.

2. The landscape controller housing of claim 1, further comprising a first electrical connector mounted in the face pack enclosure.

3. The landscape controller of claim 2, further comprising a second electrical connector mounted in the outer housing.

4. The landscape controller of claim 3, further comprising a cable with third and fourth electrical connectors that mate with the first and second electrical connectors, respectively.

5. The landscape controller of claim 1, wherein the outer housing includes a rear portion and a door dimensioned to cover a front opening defined by an interior of the rear housing portion, and a hinge assembly connected to a side edge of the door and a side edge of the rear housing portion.

6. The landscape controller of claim 1, further comprising a plurality of wire connection terminals mounted in the outer housing, the wire connection terminals being concealed behind the face pack when the face pack is installed in the outer housing in the normal upright position, and the wire connection terminals being accessible for manually connecting wires to the wire connection terminals when the face pack is in the service position.

7. The landscape controller of claim 1, wherein the face pack enclosure includes a cut-out region.

8. The landscape controller of claim 1, wherein each of the pivot pins has a truncated cylindrical configuration including a pair of opposing flat outer surfaces.

9. The landscape controller of claim 1, wherein the locking pin has a truncated cylindrical configuration including a pair of opposing flat outer surfaces.

10. A landscape controller housing, comprising:
a face pack including an enclosure, at least one manual input device mounted in a front side of the enclosure, a pair of pivot pins extending from a pair of opposite ends of the enclosure, and a pair of locking pins extending from the opposite ends of the enclosure and spaced from the pivot pins; and
a rear housing portion defining an interior sufficiently large to enclose the face pack, the rear housing including a chassis having a pair of bearing slots each on opposite sides of the chassis, the bearing slots being configured such that the face pack can be installed in the rear housing portion in a normal upright position in which the pivot pins are each received in a corresponding one of the bearing slots the face pack can be swung through a predetermined angle to allow the face pack to be removed from the rear housing portion by sliding the pivot pins out of the bearing slots, and the face pack can be inserted into the rear housing portion into a substantially horizontal service position by sliding both the pivot pins and the locking pins into the bearing slots.

11. The landscape controller of claim 10, further comprising a first electrical connector mounted in the face pack enclosure.

12. The landscape controller of claim 11, further comprising a second electrical connector mounted in the rear housing portion.

13. The landscape controller of claim 12, further comprising a cable with third and fourth electrical connectors that mate with the first and second electrical connectors, respectively.

14. The landscape controller of claim 10, further comprising a door dimensioned to cover a front opening defined by the interior of the rear housing portions, and a hinge assembly connected to a side edge of the door and a side edge of the rear housing portion.

15. The landscape controller of claim 10, further comprising a plurality of wire connection terminals mounted in the rear housing portions, the wire connection terminals being concealed behind the face pack when the face pack is installed in the rear housing portion in the normal upright position, and the wire connection terminals being accessible for manually connecting wires to the wire connection terminals when the face pack is in the service position.

16. The landscape controller of claim 10, wherein the face pack enclosure includes a cut-out region.

17. The landscape controller of claim 10, wherein each of the pivot pins has a truncated cylindrical configuration including a pair of opposing flat outer surfaces.

18. The landscape controller of claim 10, wherein the locking pin has a truncated cylindrical configuration including a pair of opposing flat outer surfaces.

* * * * *